US012598793B2

(12) United States Patent
Mizukami et al.

(10) Patent No.: US 12,598,793 B2
(45) Date of Patent: Apr. 7, 2026

(54) SEMICONDUCTOR DEVICE AND METHOD FOR MANUFACTURING THE SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Makoto Mizukami, Ibo Hyogo (JP); Takuma Suzuki, Himeji Hyogo (JP); Shunsuke Asaba, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 644 days.

(21) Appl. No.: 17/901,714

(22) Filed: Sep. 1, 2022

(65) Prior Publication Data
US 2023/0299151 A1    Sep. 21, 2023

(30) Foreign Application Priority Data
Mar. 15, 2022    (JP) ................................. 2022-039837

(51) Int. Cl.
*H10D 62/60*    (2025.01)
*H10D 48/01*    (2025.01)
*H10D 62/832*    (2025.01)

(52) U.S. Cl.
CPC ............. *H10D 62/60* (2025.01); *H10D 48/01* (2025.01); *H10D 62/8325* (2025.01)

(58) Field of Classification Search
CPC .. H10D 62/60; H10D 12/031; H10D 62/8325; H10D 30/668; H10D 62/393; H10D 62/157
See application file for complete search history.

(56) References Cited

U.S. PATENT DOCUMENTS 6,551,909 B1    4/2003  Fujihira
7,737,469 B2    6/2010  Saito et al.
(Continued)

FOREIGN PATENT DOCUMENTS

JP    2000-040822 A    2/2000
JP    2004-119611 A    4/2004
(Continued)

OTHER PUBLICATIONS

Machine Translation of Ono (JP 2009130106 A) (Year: 2009).*
(Continued)

*Primary Examiner* — Jacob Y Choi
*Assistant Examiner* — Aaron Michael Wegner
(74) *Attorney, Agent, or Firm* — Kim & Stewart LLP

(57) ABSTRACT
A semiconductor device includes a first electrode, a first semiconductor layer of a first conductivity type on the first electrode, a first pillar of a second conductivity type on the first semiconductor layer, the first pillar having a first average concentration of impurities, a second pillar of the first conductivity type on the first semiconductor layer, and including a first layer having a second average concentration of impurities lower than the first average concentration, and a second layer having a third average concentration of impurities higher than the first average concentration, a second semiconductor layer of the second conductivity type on the second pillar, a third semiconductor layer of the first conductivity type on the second semiconductor layer, a second electrode connected to the first pillar and the third semiconductor layer, a third electrode, and an insulating film disposed between the second semiconductor layer and the third electrode.

9 Claims, 12 Drawing Sheets

(56)                    References Cited

U.S. PATENT DOCUMENTS

| | | | |
|---|---|---|---|
| 9,972,713 B2 | 5/2018 | Eguchi et al. | |
| 2004/0056306 A1 | 3/2004 | Saito | |
| 2008/0150073 A1 | 6/2008 | Willmeroth | |
| 2012/0012929 A1 | 1/2012 | Saito | |
| 2016/0020101 A1 | 1/2016 | Nishimura | |
| 2020/0083320 A1* | 3/2020 | Ohta | H10D 30/665 |
| 2020/0235203 A1* | 7/2020 | Furuhashi | H10D 30/63 |
| 2021/0074808 A1* | 3/2021 | Nishimura | H10D 30/665 |

FOREIGN PATENT DOCUMENTS

| | | | | |
|---|---|---|---|---|
| JP | 2007-335844 A | | 12/2007 | |
| JP | 2008-205431 A | | 9/2008 | |
| JP | 2009130106 A | * | 6/2009 | H01L 21/336 |
| JP | 2012-023272 A | | 2/2012 | |
| JP | 2016-021538 A | | 2/2016 | |
| JP | 2016-192541 A | | 11/2016 | |
| JP | 2018-129532 A | | 8/2018 | |

OTHER PUBLICATIONS

Japanese Office Action mailed Apr. 22, 2025 in corresponding Japanese Patent Application 2022-039837 with English Translation, 10 pages.

* cited by examiner

NITROGEN
CONCENTRATION
(LOGARITHM)

ALUMINUM
CONCENTRATION
(LOGARITHM)

NITROGEN
CONCENTRATION
(LOGARITHM)

ALUMINUM
CONCENTRATION
(LOGARITHM)

SEMICONDUCTOR DEVICE AND METHOD FOR MANUFACTURING THE SAME

CROSS-REFERENCE TO RELATED APPLICATION(S)

This application is based upon and claims the benefit of priority from Japanese Patent Application No. 2022-039837, filed Mar. 15, 2022, the entire contents of which are incorporated herein by reference.

FIELD

Embodiments described herein relate generally to a semiconductor device and a method for manufacturing the same.

BACKGROUND

A power semiconductor device using silicon carbide as an alternative to silicon is under development. A semiconductor device using silicon carbide has a higher resistance against a strong electric field than a semiconductor device using silicon and is, therefore, capable of improving the balance between a breakdown voltage and an ON resistance. Even such a semiconductor device is required to provide higher switching speeds.

DETAILED DESCRIPTION

Figure 1:
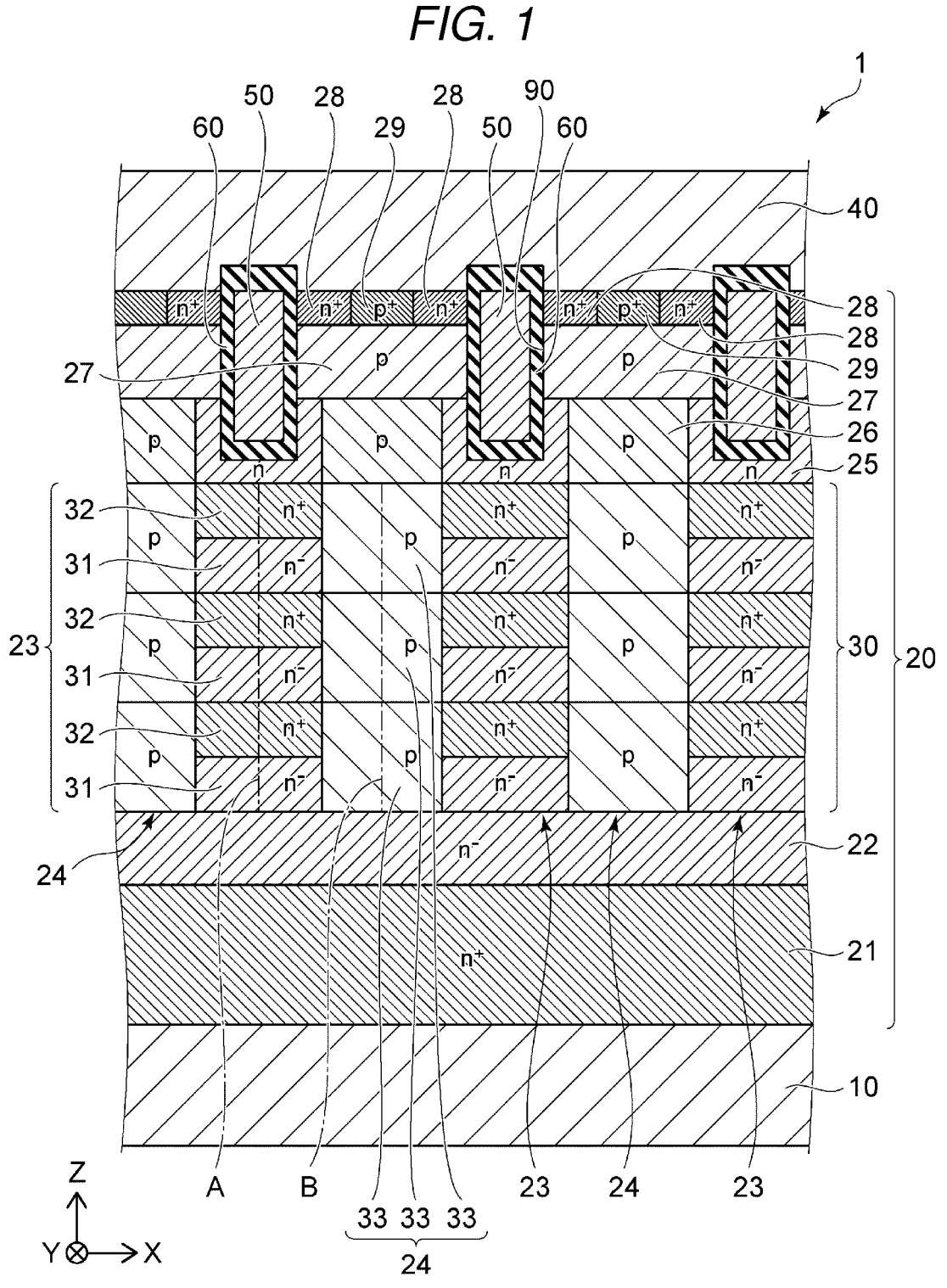
FIG. 1 is a cross-sectional view illustrating a semiconductor device according to a first embodiment.

Embodiments provides a semiconductor device capable of increasing a switching speed and a method for manufacturing the same.

In general, according to one embodiment, a semiconductor device includes a first electrode, a first semiconductor layer of a first conductivity type provided on the first electrode, a first pillar of a second conductivity type provided on the first semiconductor layer, the first pillar having a first average concentration of impurities of the second conductivity type, a second pillar of the first conductivity type provided on the first semiconductor layer, and including a first layer having a second average concentration of impurities of the first conductivity type, that is lower than the first average concentration, and a second layer having a third average concentration of impurities of the first conductivity type, that is higher than the first average concentration, a second semiconductor layer of the second conductivity type provided on second pillar, a third semiconductor layer of the first conductivity type provided on the second semiconductor layer, a second electrode connected to the first pillar and the third semiconductor layer, a third electrode, and an insulating film disposed between the second semiconductor layer and the third electrode.

According to one embodiment, a method for manufacturing a semiconductor device includes injecting impurities of a second conductivity type into a first part of a first semiconductor layer of a first conductivity type, and injecting impurities of the first conductivity type into a second part of the first semiconductor layer, wherein the impurities of the first conductivity type are injected less deeply into the second part than the impurities of the second conductivity type are injected into the first part, forming an epitaxial layer of the first conductivity type on the first semiconductor layer; injecting impurities of the second conductivity type impurity into a third part of the epitaxial layer that is aligned vertically with the first part, and injecting impurities of the first conductivity type into a fourth part of the epitaxial layer that is aligned vertically with the second part, wherein the impurities of the first conductivity type are injected less deeply into the fourth part than the impurities of the second conductivity type are injected into the third part, forming a second semiconductor layer of the second conductivity type on the epitaxial layer, forming a third semiconductor layer of the first conductivity type above the second semiconductor layer, forming an insulating film in contact with the second semiconductor layer, forming a third electrode that is separated from the second semiconductor layer by the insulating film; and forming a first electrode connected to the first semiconductor layer, and forming a second electrode connected to the third part and the third semiconductor layer.

According to another embodiment, a method for manufacturing a semiconductor device includes injecting impurities of a first conductivity type into a first part of a first semiconductor layer of the first conductivity type, forming a first epitaxial layer of the first conductivity type on the first semiconductor layer, injecting impurities of the first conductivity type impurity into a second part of the first epitaxial layer that is aligned vertically with the first part, forming a hole penetrating the first epitaxial layer and reaching an interior of the first semiconductor layer; forming a second epitaxial layer of a second conductivity type in the hole, forming a second semiconductor layer of the second conductivity type above the first epitaxial layer and the second epitaxial layer, forming a third semiconductor layer of the first conductivity type on the second semiconductor layer, forming an insulating film in contact with the second semiconductor layer, forming a third electrode that is separate from the second semiconductor layer by the insulating film; and forming a first electrode connected to the first semiconductor layer, and forming a second electrode connected to the second epitaxial layer and the third semiconductor layer.

First Embodiment

A first embodiment will be described hereinafter.

FIG. 1 is a cross-sectional view illustrating a semiconductor device according to the first embodiment.

Figures 2A, 2B:
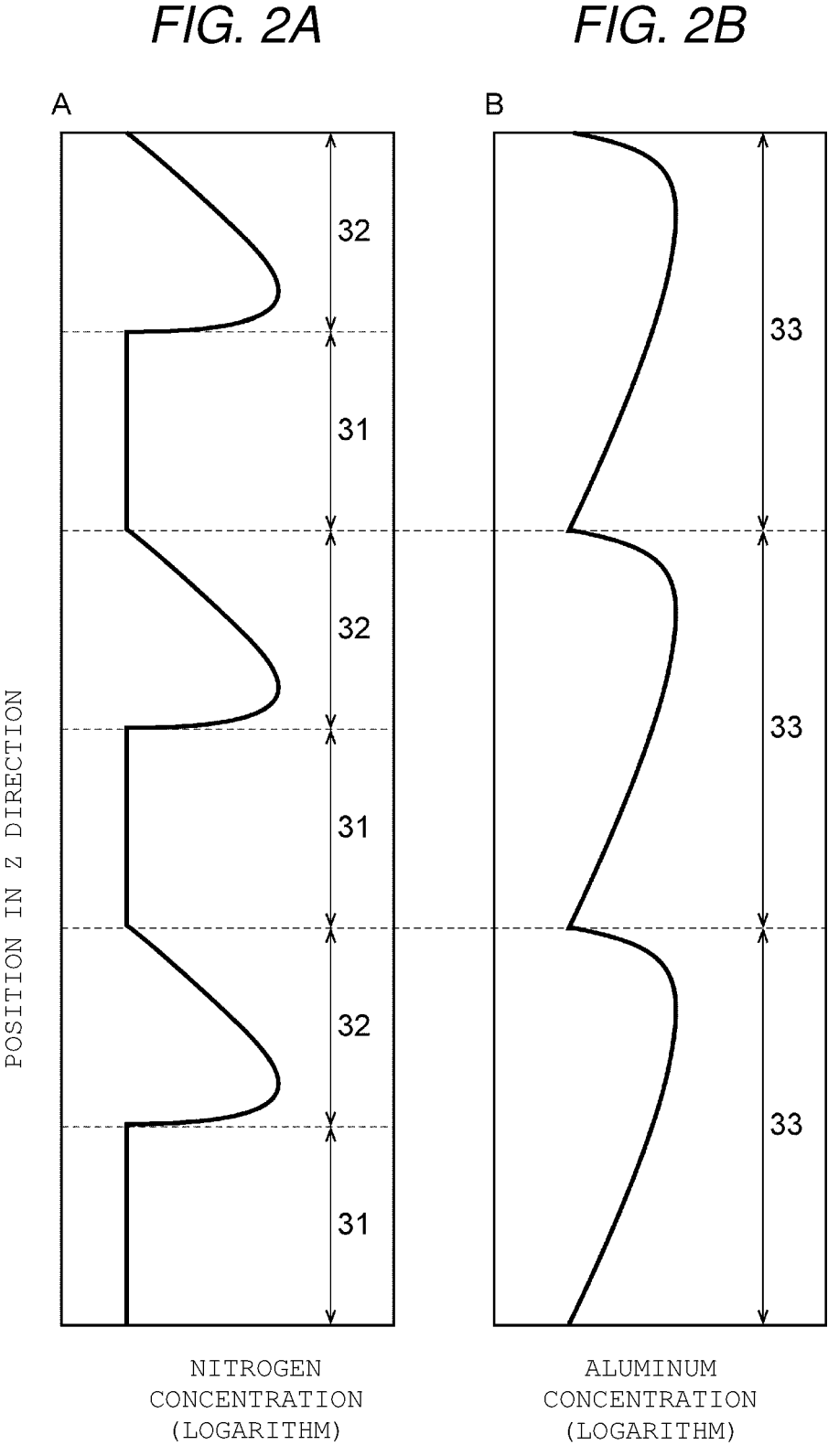
FIG. 2A is a graph illustrating a nitrogen concentration profile of an n type pillar along line A illustrated in FIG. 1.
FIG. 2B is a graph illustrating an aluminum concentration profile of a p type pillar along line B illustrated in FIG. 1.

FIG. 2A is a graph illustrating a nitrogen concentration profile of an n type pillar along line A illustrated in FIG. 1. The horizontal axis indicates a nitrogen concentration and the vertical axis indicates a position along line A illustrated in FIG. 1. FIG. 2B is a graph illustrating an aluminum concentration profile along line B illustrated in FIG. 1. The horizontal axis indicates an aluminum concentration and the vertical axis indicates a position along line B illustrated in FIG. 1.

It is noted that the drawings are schematic and simplified as appropriate. In addition, dimensional proportions of elements do not always match one another in FIGS. 1, 2A, and 2B. The same applies to the other drawings to be described later.

As illustrated in FIG. 1, a semiconductor device 1 according to the present embodiment is a trench gate type MOSFET (Metal-Oxide-Semiconductor Field-Effect Transistor) The semiconductor device 1 includes a drain electrode 10, a semiconductor part 20, a source electrode 40, a gate electrode 50, and a gate insulating film 60.

In the present specification, an XYZ orthogonal coordinate system is adopted for the sake of convenience. A direction that connects the drain electrode 10 to the source electrode 40 is defined as the "Z direction", a direction in which the gate electrode 50 extends is defined as the "Y direction", and a direction orthogonal to the Z direction and the Y direction is defined as the "X direction". In addition, in the Z direction, a direction from the drain electrode 10 to the source electrode 40 is referred to as an "upper direction" while an opposite direction to the upper direction is a "lower direction". However, the expressions are used for the sake of convenience and irrelevant to the direction of gravity.

The drain electrode 10 and the source electrode 40 are plate-shaped to spread along the XY plane. The semiconductor part 20 is disposed on the drain electrode 10. The source electrode 40 is disposed on the semiconductor part 20. The gate electrode 50 is disposed in the semiconductor part 20. A plurality of gate electrodes 50 are provided and arranged along the X direction. Each gate electrode 50 extends in the Y direction. Each gate electrode 50 is connected to a gate pad, not illustrated, provided on the semiconductor part 20, and a voltage is applied to the gate electrode 50 from outside. The gate insulating film 60 is disposed between each gate electrode 50 and the semiconductor part 20 and insulates the gate electrode 50 from the semiconductor part 20.

The semiconductor part 20 contains silicon carbide (SiC) and is formed from, for example, a single crystal of silicon carbide. An impurity to serve as either a donor or an acceptor is locally injected into the semiconductor part 20 and a conductivity type of each part is either an n type or a p type. Examples of the impurity to serve as the donor include nitrogen (N) while examples of the impurity to serve as the acceptor include aluminum (Al). The gate insulating film 60 contains silicon oxide ($SiO_2$). In the present specification, the impurity that makes the semiconductor part 20 into a first conductivity type is also referred to as "first conductivity type impurity" and the impurity that makes the semiconductor part 20 into a second conductivity type is also referred to as "second conductivity type impurity". For example, when the first conductivity type is the n type, the first conductivity type impurity is the impurity to serve as the donor, e.g., nitrogen. When the second conductivity type is the p type, the second conductivity type impurity is the impurity to serve the acceptor, e.g., aluminum.

The semiconductor part 20 includes a drain layer 21, a drift layer 22, an n type pillar 23, a p type pillar 24, an n type layer 25, a p type layer 26, a base layer 27, a source layer 28, and a contact layer 29. A conductivity type of the drain layer 21 is, for example, an $n^+$ type. A conductivity type of the drift layer 22 is, for example, an $n^-$ type. A conductivity type of the n type pillar 23 is, for example, an n type as a whole. A conductivity type of the p type pillar 24 is, for example, a p type. A conductivity type of the n type layer 25 is, for example, an n type. A conductivity type of the p type layer 26 is, for example, a p type. A conductivity type of the base layer 27 is, for example, a p type. A conductivity type of the source layer 28 is, for example, an $n^+$ type. A conductivity type of the contact layer 29 is, for example, a $p^+$ type.

Superscript symbols added to characters "n" and "p" each indicating the conductivity type represent relative amounts of the impurity concentration. The n type include the "$n^+$ type", the "n type", and the "$n^-$ type" in a descending order of the impurity concentration. The same applies to the p type. Furthermore, in the present specification, the "impurity concentration" refers to an effective impurity concentration contributing to the conductivity of a semiconductor. In addition, the "impurity concentration" refers to an impurity concentration from which an offset is removed when a given region contains both the impurity to serve as the donor and the impurity to serve as the acceptor.

The $n^+$ type drain layer 21 is disposed on, in contact with, and connected to the drain electrode 10. In the present specification, "connection" means "electrical connection". The $n^-$ type drift layer 22 is disposed on, in contact with, and connected to the drain layer 21. The drift layer 22 is lower in impurity concentration than the drain layer 21. The drain layer 21 and the drift layer 22 is referred to herein as a first semiconductor layer.

The n type pillar 23 and the p type pillar 24 are disposed on and in contact with the drift layer 22. A plurality of n type pillars 23 and a plurality of p type pillars 24 are provided. The plurality of n type pillars 23 and the plurality of p type pillars 24 form a super junction (SJ) structure 30. Each n type pillar 23 and each p type pillar 24 are exposed on both a lower surface and an upper surface of the SJ structure 30.

For example, in FIG. 1, the n type pillars 23 and the p type pillars 24 are of a plate shape spreading along a YZ plane and alternately arranged along, for example, the X direction. A pn interface is thereby formed on contact surfaces between each n type pillar 23 and the p type pillar 24.

An array of the n type pillars 23 and the p type pillars 24 in the SJ structure 30 is not limited to the above example. For example, the n type pillars 23 and the p type pillars 24 may be alternately arranged along the Y direction. Alternatively, the n type pillars 23 and the p type pillars 24 may be of a columnar shape extending in the Z direction and arranged in a staggered manner in a view from the Z direction. In another alternative, a plurality of n type pillars 23 extending in the Z direction may be disposed in a grid of p type pillars 24 when viewed from the Z direction, or a plurality of columnar p type pillars 24 extending in the Z direction may be disposed in a grid of n type pillars 23 when viewed from the Z direction. However, in any of the arrangements, an amount of impurity to serve as the donor is substantially identical to an amount of impurity to serve as the acceptor in the entire SJ structure 30.

In each of the n type pillars 23, low-concentration layers 31 of the n⁻ type and high-concentration layers 32 of the n⁺ type are alternately arranged along the Z direction. The low-concentration layer 31 is disposed in a lowermost portion of the n type pillar 23 and the high-concentration layer 32 is disposed in an uppermost portion of the n type pillar 23. An average value of impurity concentrations of the high-concentration layers 32 is higher than an average value of impurity concentrations of the low-concentration layers 31.

As illustrated in FIG. 2A, a nitrogen concentration profile along the Z direction is nearly flat in each low-concentration layer 31, and a nitrogen concentration profile along the Z direction has one peak in each high-concentration layer 32. Because of this, a difference between a maximum value and a minimum value of nitrogen concentrations in each low-concentration layer 31 is smaller than a difference between a maximum value and a minimum value of nitrogen concentrations in each high-concentration layer 32.

As illustrated in FIG. 1, in each of the p type pillars 24, a plurality of p type layers 33 are arranged along the Z direction. Each p type layer 33 corresponds to a pair of one low-concentration layer 31 and one high-concentration layer 32 adjacent in the Z direction. An average value of impurity concentrations of each p type layer 33 is higher than the average value of the impurity concentrations of the low-concentration layer 31 in the n type pillar 23 and lower than the average value of the impurity concentrations of the high-concentration layer 32 in the n type pillar 23.

As illustrated in FIG. 2B, an aluminum concentration profile along the Z direction has one peak in each p type layer 33. In addition, an amount of nitrogen contained in each n type pillar 23 is substantially equal to an amount of aluminum contained in each p type pillar 24. The peak of the aluminum concentration in each p type layer 33 is, therefore, lower than the peak of the nitrogen concentration in the high-concentration layer 32 in the n type pillar 23. The plurality of p type layers 33 that form each p type pillar 24 have similar peak shapes. Because of this, a difference between a maximum value and a minimum value of the aluminum concentrations in each of the p type pillars 24 is greater than the difference between the maximum value and the minimum value of the nitrogen concentrations in each low-concentration layer 31 in the n type pillar 23, and smaller than the difference between the maximum value and the minimum value of the nitrogen concentrations in each high-concentration layer 32 in the n type pillar 23.

The average value, the maximum value, and the minimum value of the impurity concentrations in each layer can be determined, for example, by the following method. Impurity concentrations are measured at ten points arranged equidistantly along the Z direction in a layer of interest, an average value of obtained ten measured values is defined as the "average value" of the impurity concentrations of the layer, a maximum value of the ten measured values is defined as the "maximum value" of the impurity concentrations of the layer, and a minimum value of the ten measured values is defined as the "minimum value" of the impurity concentrations of the layer.

As illustrated in FIG. 1, the n type layer 25 is disposed on the n type pillars 23. The p type layer 26 is disposed on the p type pillars 24. The p type base layer 27 is disposed on and in contact with the n type layer 25 and the p type layer 26. The n⁺ type source layer 28 is disposed on part of the base layer 27. The source layer 28 is in contact with the base layer 27. A plurality of source layers 28 are provided and arranged along the X direction. Each source layer 28 extends in the Y direction. The p⁺ type contact layer 29 is disposed on the other parts of the base layer 27. The contact layer 29 is in contact with the base layer 27 and the source layers 28. A plurality of contact layers 29 are provided and arranged along the X direction. Each contact layer 29 extends in the Y direction.

The source electrode 40 is disposed and connected to the source layers 28 and the contact layers 29. The gate electrode 50 is disposed in an upper portion of each n type layer 25, in the base layer 27, and in each source layer 28. In other words, the gate electrode 50 penetrates the source layers 28 and the base layer 27 in the Z direction and a lower end of the gate electrode 50 is located in the upper portion of each n type layer 25. The gate insulating film 60 covers and contacts the gate electrode 50. The gate insulating film 60 is disposed between each n type layer 25 and the gate electrode 50, between the base layer 27 and the gate electrode 50, and between each source layer 28 and the gate electrode 50.

Positional relationships are not limited to those in the example, so long as when one p type pillar 24 is connected to the source electrode 40 and a higher voltage than a threshold voltage is applied to the gate electrode 50, an inversion layer is formed in part of the base layer 27 and a current path connected to the n type pillar 23 from the source layer 28 via the inversion layer is formed.

Next, a method for manufacturing the semiconductor device 1 according to the present embodiment will be described.

FIGS. 3A to 3D and 4A to 4C are cross-sectional views illustrating the method for manufacturing the semiconductor device according to the present embodiment.

First, a semiconductor substrate which is formed from silicon carbide and the conductivity type of which is the n⁺ type is prepared. This semiconductor substrate is not shown in FIG. 3A and is a part that becomes the drain layer 21 in the semiconductor device 1 after completion.

Figure 3A:
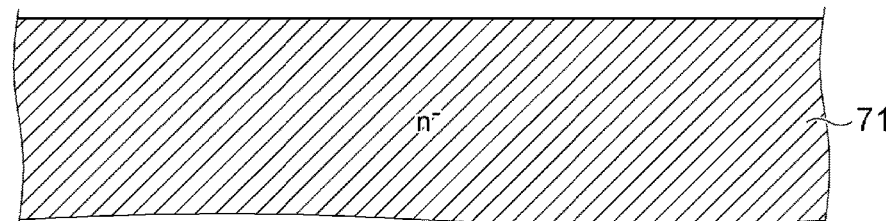
FIGS. 3A-3D and 4A-4C are cross-sectional views illustrating a method for manufacturing the semiconductor device according to the first embodiment.

Next, as illustrated in FIG. 3A, an epitaxial layer 71 which is formed from silicon carbide and the conductivity type of which is the n⁻ type is epitaxially grown from an upper surface of the semiconductor substrate. The epitaxial layer 71 is thereby formed on the semiconductor substrate. The epitaxial layer 71 uniformly contains the impurity to serve as the donor, e.g., nitrogen.

Figure 3B:
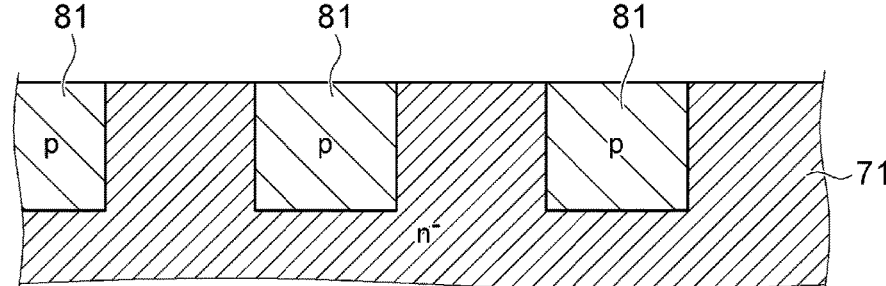

Next, as illustrated in FIG. 3B, ions of the impurity to serve as the acceptor, e.g., aluminum, are implanted into a part 81 in an upper layer portion of the epitaxial layer 71. The part 81 is to become a lower portion of each of the p type pillars 24. For example, a plurality of parts 81 are provided and arranged along the X direction. The parts 81 extend in the Y direction.

Figure 3C:
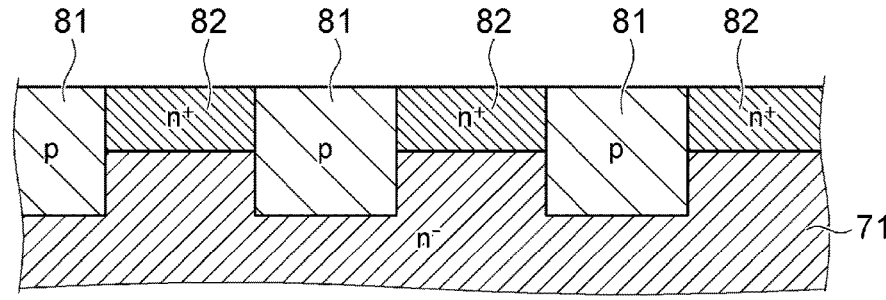

Next, as illustrated in FIG. 3C, ions of the impurity to serve as the donor, e.g., nitrogen are implanted into a part 82 in the upper layer portion of the epitaxial layer 71. The part 82 is in contact with the parts 81 and shallower than the parts 81. The part 82 is to become a lower portion of each of the n type pillars 23. For example, a plurality of parts 82 are provided and arranged along the X direction. The parts 82 extend in the Y direction. In the Z direction, upper surfaces of the parts 82 are substantially flush with upper surfaces of the parts 81 and flush with an upper surface of the epitaxial layer 71. On the other hand, lower surfaces of the parts 82 are above lower surfaces of the parts 81. An order of the process illustrated in FIG. 3B and the process illustrated in FIG. 3C may be reversed.

Figure 3D:
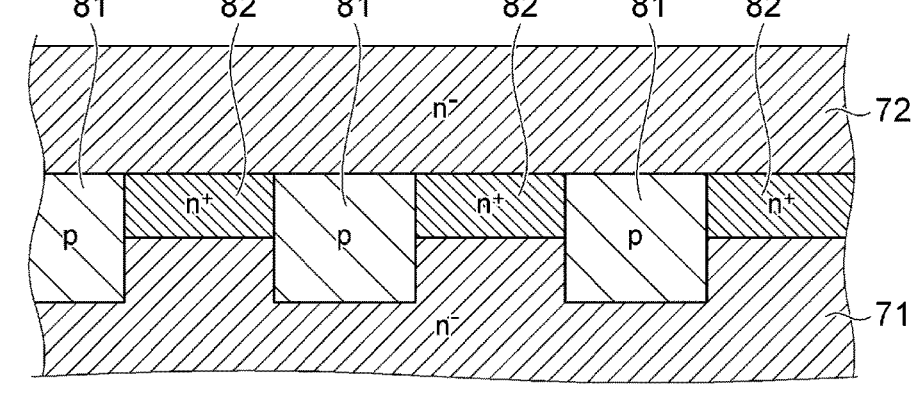
Figure 3D:
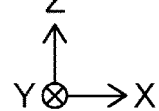

Next, as illustrated in FIG. 3D, an epitaxial layer 72 which is formed from silicon carbide and the conductivity type of which is the n⁻ type is epitaxially grown from an upper surface of the epitaxial layer 71. The epitaxial layer 72 is thereby formed on the epitaxial layer 71. The epitaxial layer 72 uniformly contains the impurity to serve as the donor, e.g., nitrogen.

Figures 4A, 4B, 4C:
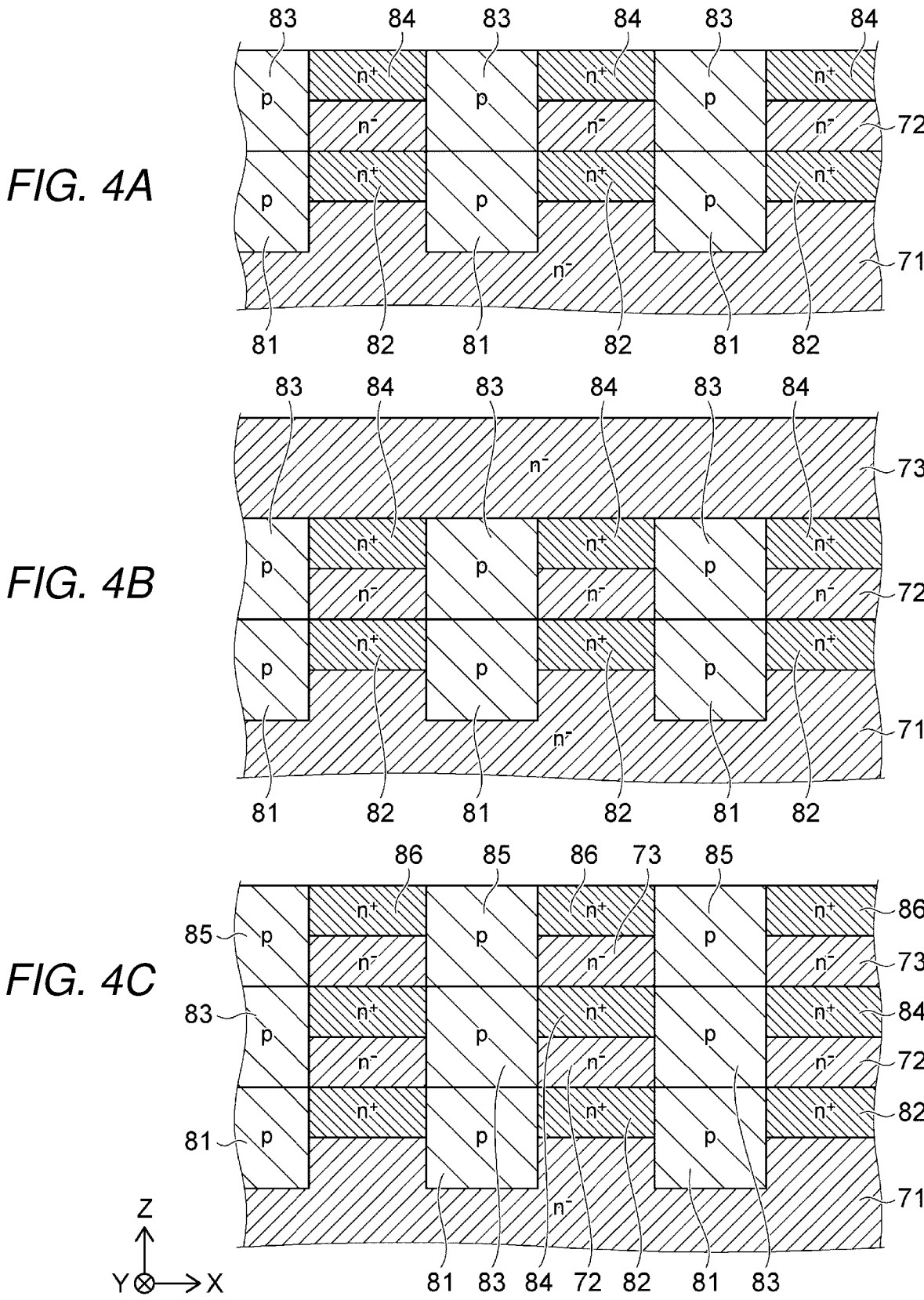

Next, as illustrated in FIG. 4A, ions of the impurity to serve as the acceptor, e.g., aluminum are implanted into parts 83 of the epitaxial layer 72. The parts 83 are located immediately on and in contact with the parts 81. Next, ions of the impurity to serve as the donor, e.g., nitrogen are implanted into parts 84 of the epitaxial layer 72. The parts 84 are located immediately above the parts 82 and in contact with the parts 83. Furthermore, the parts 84 are shallower than the parts 83. Because this, the parts 84 are isolated from the parts 82. In the Z direction, upper surfaces of the parts 84 are substantially flush with upper surfaces of the parts 83 and flush with an upper surface of the epitaxial layer 72. On the other hand, lower surfaces of the parts 84 are above lower surfaces of the parts 83. An order of the process of injecting aluminum into the parts 83 and the process of injecting nitrogen into the parts 84 may be reversed.

Next, as illustrated in FIG. 4B, an epitaxial layer 73 which is formed from silicon carbide and the conductivity type of which is the n⁻ type is epitaxially grown from an upper surface of the epitaxial layer 72. The epitaxial layer 73 is thereby formed on the epitaxial layer 72. The epitaxial layer 73 uniformly contains the impurity to serve as the donor, e.g., nitrogen.

Next, as illustrated in FIG. 4C, ions of the impurity to serve as the acceptor, e.g., aluminum are implanted into parts 85 of the epitaxial layer 73. The parts 85 are located immediately on and in contact with the parts 83. Next, ions of the impurity to serve as the donor, e.g., nitrogen are implanted into parts 86 of the epitaxial layer 73. The parts 86 are located immediately above the parts 84 and in contact with the parts 85. Furthermore, the parts 86 are shallower than the parts 85. Because of this, the parts 86 are isolated from the parts 84. In the Z direction, upper surfaces of the parts 86 are substantially flush with upper surfaces of the parts 85 and flush with an upper surface of the epitaxial layer 73. On the other hand, lower surfaces of the parts 86 are above lower surfaces of the parts 85. An order of the process of injecting aluminum into the parts 85 and the process of injecting nitrogen into the parts 86 may be reversed.

Subsequently and similarly to the process described above, the process of forming the epitaxial layer which is formed from silicon carbide and the conductivity type of which is n⁻ type, the process of injecting the impurity to serve as the acceptor into part of this epitaxial layer, and the process of injecting the impurity to serve as the donor into the other part of this epitaxial layer is repeated a pre-selected number of times.

By activating the impurities injected into the parts, part of the epitaxial layer 71 except for the upper layer portion thereof becomes the n⁻ type drift layer 22. Furthermore, the parts 81, 83, and 85 become the p type layers 33. The p type layers 33 arranged in a line along the Z direction form one p type pillar 23. On the other hand, parts located between the p type pillars 24 in the epitaxial layers 71 to 73 become the n type pillars 23. In each of the n type pillars 23, the parts 82, 84, and 86 become the high-concentration layers 32, respectively and the rest becomes the low-concentration layers 31.

Next, as illustrated in FIG. 1, the n type layer 25 is formed on the parts 86 of the epitaxial layer 72, and the p type layer

26 is formed on the parts 85. Next, the p type base layer 27 is formed on the n type layer 25 and the p type layer 26. Next, the n⁺ type source layers 28 and the p⁺ type contact layers 29 are formed on the base layer 27. In this way, the semiconductor part 20 is formed.

Next, trenches 90 are formed on an upper surface of the semiconductor part 20. For example, each of the trenches 90 is formed immediately above each of the n type pillars 23 and a lower end of the trench 90 reaches an interior of the n type layer 25. Next, the gate insulating film 60 is formed on an inner surface of each of the trenches 90. Next, the gate electrode 50 is formed in each of the trenches 90 and on an inner surface of the gate insulating film 60. The gate electrode 50 faces the n type layer 25, the base layer 27, and the source layers 28 via the gate insulating film 60.

Next, the drain electrode 10 is formed on a lower surface of the semiconductor substrate (in particular, the drain layer 21) and the source electrode 40 is formed on the source layer 28 and the contact layers 29. The drain electrode 10 is connected to the drain layer 21, and connected to the drift layer 22, the n type pillars 23, and the n type layer 25 via the drain layer 21. The source electrode 40 is connected to the source layers 28 and the contact layers 29, and connected to the base layer 27, the p type layer 26, and the p type pillars 24 via the contact layers 29. In this way, the semiconductor device 1 according to the present embodiment is manufactured.

Next, advantageous effects of the present embodiment will be described.

In the semiconductor device 1 according to the present embodiment, the semiconductor part 20 is formed from silicon carbide. Therefore, compared with a case where the semiconductor part 20 is formed from silicon, it is possible to withstand a strong electric field in an Off state. Because of this, it is possible to reduce an ON resistance while maintaining a predetermined breakdown voltage. Furthermore, the semiconductor device 1 adopts the super junction structure. Therefore, depletion layers generated from interfaces between the n type pillars 23 and the p type pillars 24 in the Off state spread and integrate in the X direction, making substantially the entire SJ structure 30 to be depleted. This enables realization of a higher breakdown voltage.

Moreover, in the semiconductor device 1, the low-concentration layers 31 and the high-concentration layers 32 are provided in the n type pillars 23, so that the depletion layers are weakly coupled in the Off state. That is, since the depletion layers tend to spread more easily in the low-concentration layers 31 than the high-concentration layers 32, the depletion layers spreading from both sides of the n type pillars 23 in the X direction contact each other first in the low-concentration layers 31 and then in the high-concentration layers 32. This results in a slow capacitance change between the drain electrode 10 and the source electrode 40 in the Off state, compared with a case where the depletion layers are made to contact one another simultaneously. Therefore, ringing of an output current is suppressed. As a result, time required for convergence of the ringing is reduced and a switching speed of the semiconductor device 1 increases.

On the other hand, the impurity concentration profile along the Z direction in the p type pillars 24 is uniform, compared with the n type pillars 23. It is thereby possible to maintain a region that is not depleted and that extends in the Z direction in each of the p type pillars 24 for a long time in the Off state, and secure a discharge path of holes lower in mobility than electrons. This can also contribute to increasing the switching speed of the semiconductor device 1.

Furthermore, in the semiconductor device 1, silicon carbide is used as a semiconductor material, which makes it more difficult for the impurity to diffuse during impurity ion implantation and activation. For this reason, the low-concentration layers 31 and the high-concentration layers 32 can be separately formed easily in the n type pillars 23, while the p type pillars 24 having a relatively uniform distribution of the impurity concentrations are formed in the processes illustrated in FIGS. 3A to 4C. It is thereby possible to manufacture the semiconductor device 1 while preventing an increase in the number of processes.

Moreover, in the present embodiment, the high-concentration layers 32 and the p type layers 33 are formed by the ion implantation. Therefore, compared with formation by epitaxial growth, an injection amount of the impurity can be controlled with high accuracy.

Furthermore, when performing ion implantation at the same acceleration voltage, aluminum ions are implanted more deeply than nitrogen ions. Because of this, the relatively deep p type layers 33 and the relatively shallow high-concentration layers 32 can be formed by the ion implantation at the same acceleration voltage. In other words, in the present embodiment, it is unnecessary to contact the high-concentration layers 32 adjacent in the Z direction; therefore, it is possible to make the p type layers 33 as thick as possible according to a performance characteristic of an ion implantation device to be used and reduce the number of times of the ion implantation. This can contribute to reducing a manufacturing cost of the semiconductor device 1.

First Modification of First Embodiment

Figure 5:
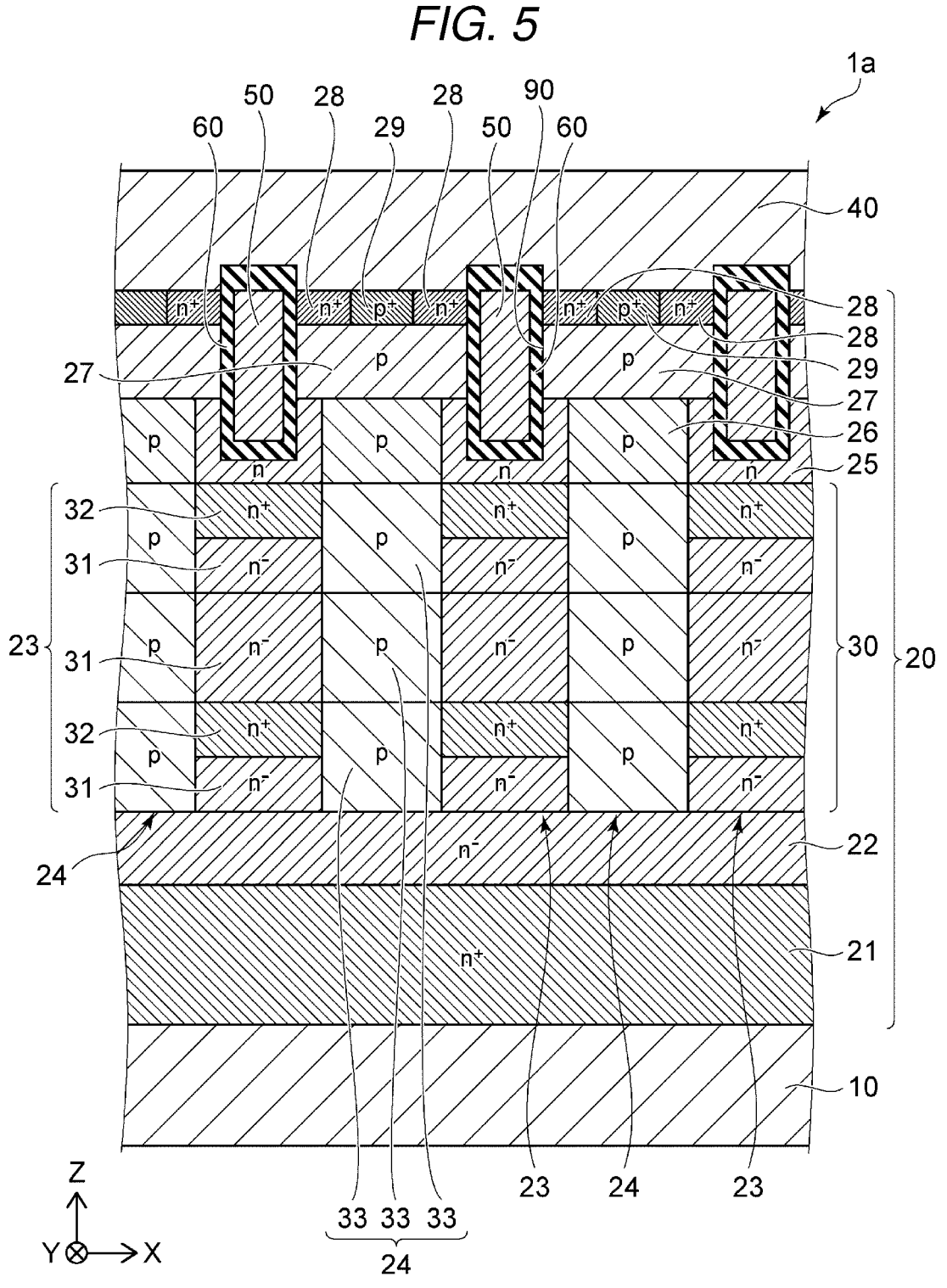
FIG. 5 is a cross-sectional view illustrating a semiconductor device according to a first modification of the first embodiment.

FIG. 5 is a cross-sectional view illustrating a semiconductor device according to a first modification.

As illustrated in FIG. 5, a semiconductor device 1a according to the present modification differs from the semiconductor device 1 (refer to FIG. 1) according to the first embodiment in that the high-concentration layers 32 are provided only in upper and lower portions of each of the n type pillars 23 and not provided in a central portion of the n-type pillar 23 in the Z direction.

Parts of the n type pillars 23 that are not the high-concentration layers 32 are the low-concentration layers 31. In the present modification, similarly to the first embodiment, the amount of impurity of each of the n type pillars 23 is substantially identical to the amount of impurity of each of the p type pillars 24. The same applies to the other modifications to be described later. The present modification is similar to the first embodiment in configurations other than those described above, a manufacturing method, and advantageous effects.

Second Modification of First Embodiment

Figure 6:
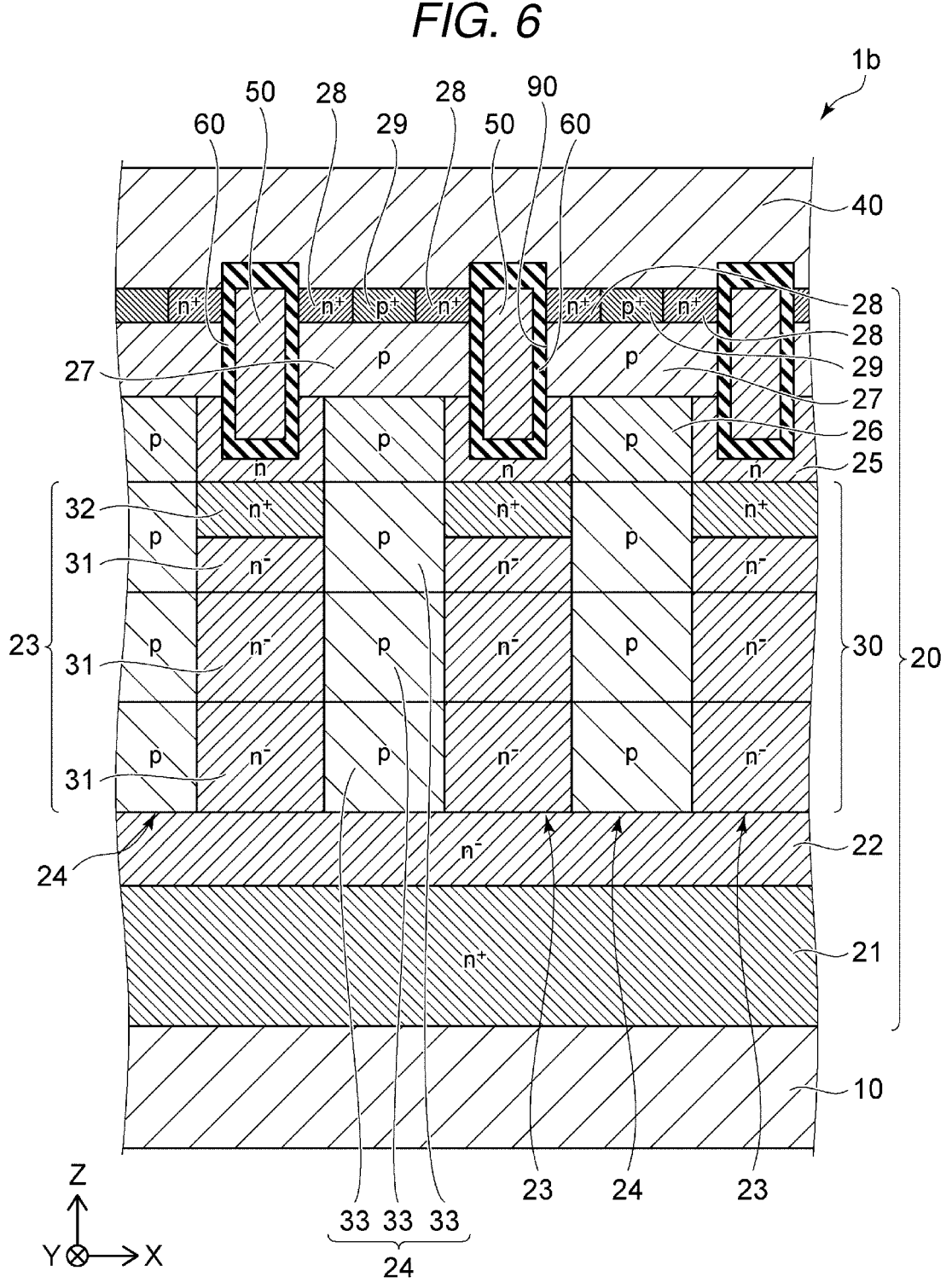
FIG. 6 is a cross-sectional view illustrating a semiconductor device according to a second modification of the first embodiment.

FIG. 6 is a cross-sectional view illustrating a semiconductor device according to a second modification.

As illustrated in FIG. 6, a semiconductor device 1b according to the present modification differs from the semiconductor device 1 (refer to FIG. 1) according to the first embodiment in that the high-concentration layers 32 are provided only in upper portions of the n type pillars 23. The present modification is similar to the first embodiment in configurations other than those described above, a manufacturing method, and advantageous effects.

Third Modification of First Embodiment

Figure 7:
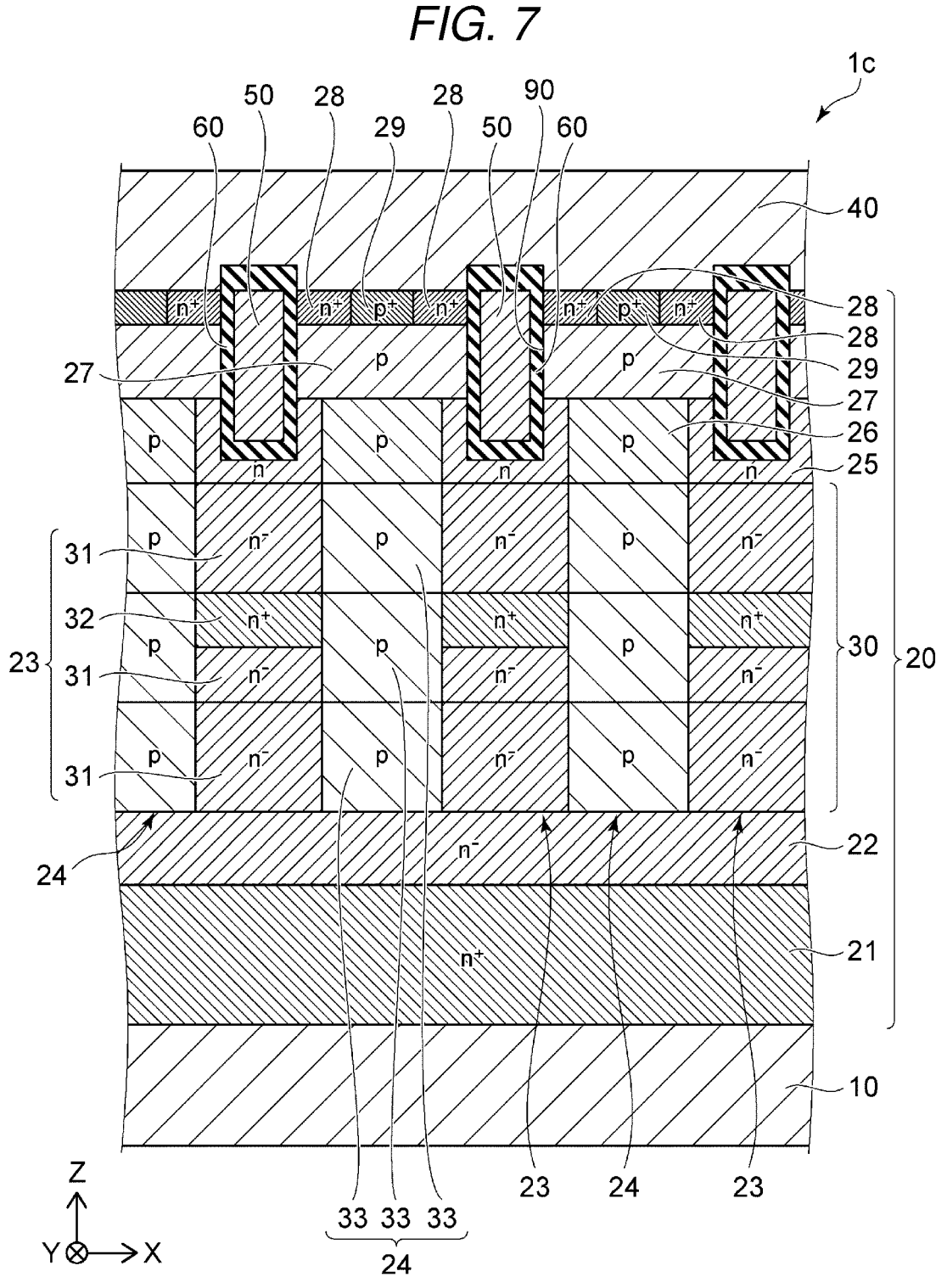
FIG. 7 is a cross-sectional view illustrating a semiconductor device according to a third modification of the first embodiment.

FIG. 7 is a cross-sectional view illustrating a semiconductor device according to a third modification.

As illustrated in FIG. 7, a semiconductor device 1c according to the present modification differs from the semiconductor device 1 (refer to FIG. 1) according to the first embodiment in that the high-concentration layers 32 are provided only in the central portions of the n type pillars 23 in the Z direction. The present modification is similar to the first embodiment in configurations other than those described above, a manufacturing method, and advantageous effects.

Fourth Modification of First Embodiment

Figure 8:
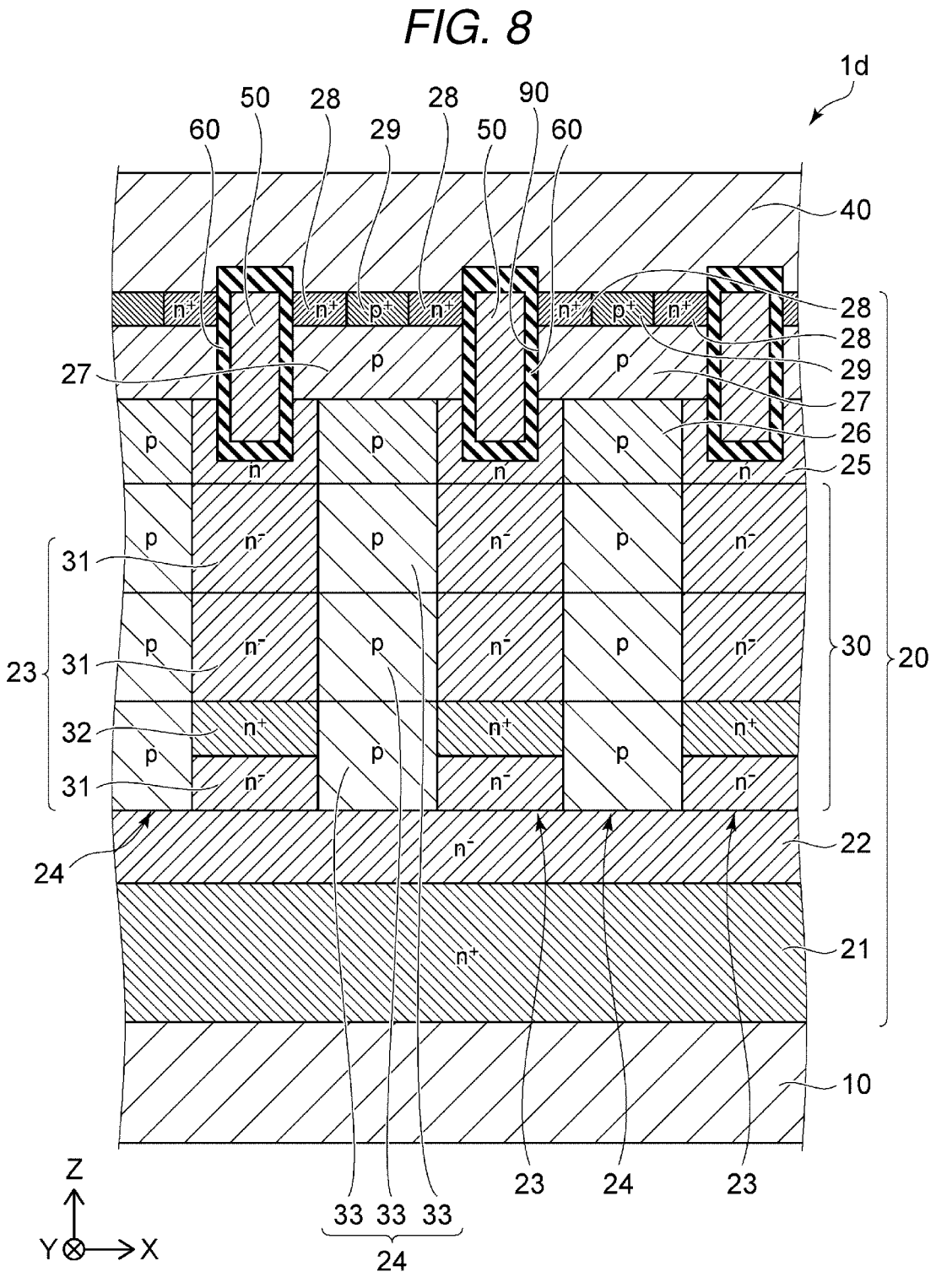
FIG. 8 is a cross-sectional view illustrating a semiconductor device according to a fourth modification of the first embodiment.

FIG. 8 is a cross-sectional view illustrating a semiconductor device according to a fourth modification.

As illustrated in FIG. 8, a semiconductor device 1d according to the present modification differs from the semiconductor device 1 (refer to FIG. 1) according to the first embodiment in that the high-concentration layers 32 are provided only in lower portions of the n type pillars 23. The present modification is similar to the first embodiment in configurations other than those described above, a manufacturing method, and advantageous effects.

Second Embodiment

Figure 9:
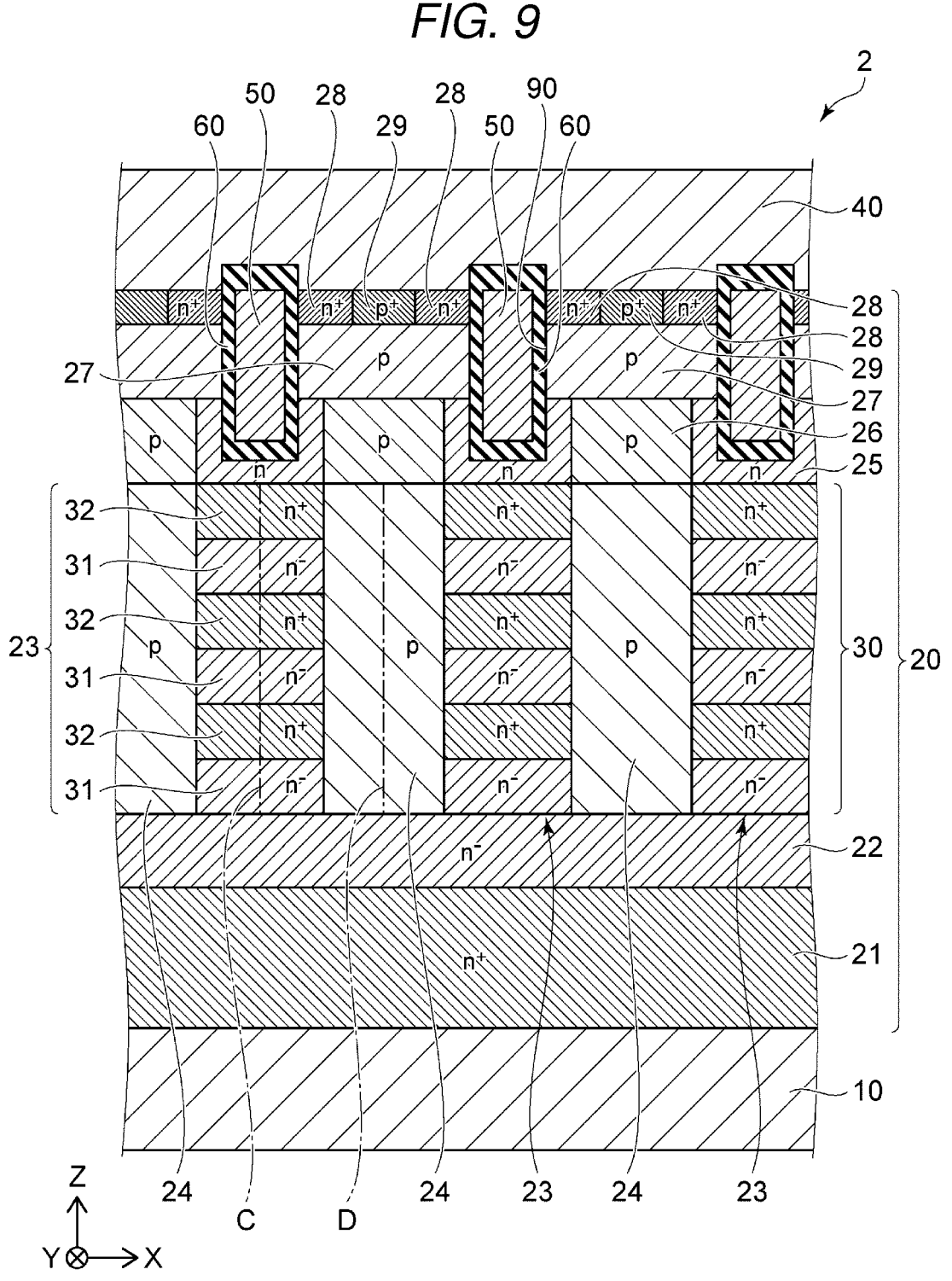
FIG. 9 is a cross-sectional view illustrating a semiconductor device according to a second embodiment.

FIG. 9 is a cross-sectional view illustrating a semiconductor device according to a second embodiment.

Figures 10A, 10B:
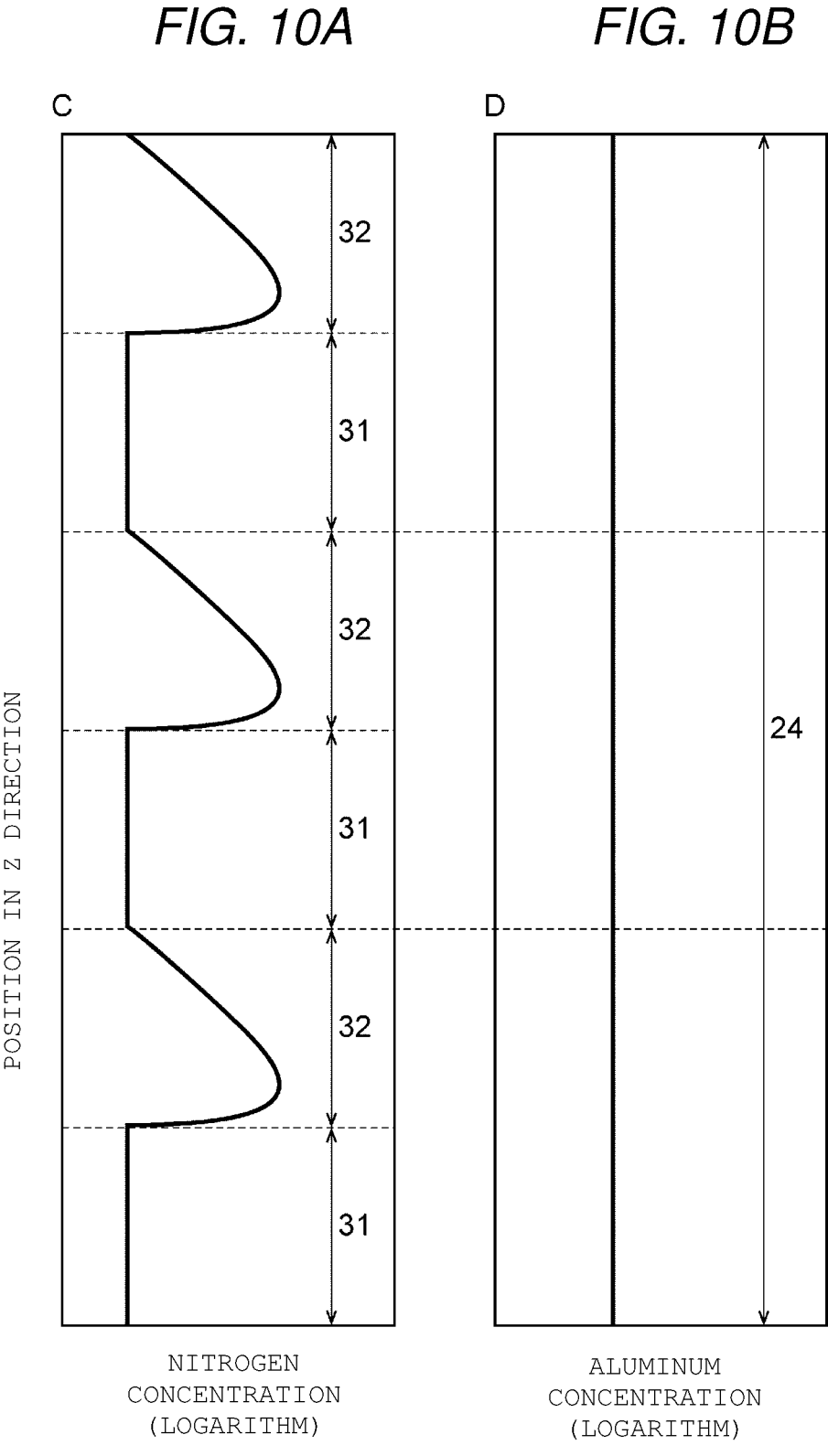
FIG. 10A is a graph illustrating a nitrogen concentration profile of an n type pillar along line C illustrated in FIG. 9.
FIG. 10B is a graph illustrating an aluminum concentration profile of a p type pillar along line D illustrated in FIG. 9.

FIG. 10A is a graph illustrating a nitrogen concentration profile of an n type pillar along line C illustrated in FIG. 9. The horizontal axis indicates a nitrogen concentration and the vertical axis indicates a position along line C illustrated in FIG. 9. FIG. 10B is a graph illustrating an aluminum concentration profile of a p type pillar along line D illustrated in FIG. 9. The horizontal axis indicates an aluminum concentration and the vertical axis indicates a position along line D illustrated in FIG. 9.

In the following, descriptions of similar parts to those in the first embodiment are omitted as appropriate.

As illustrated in FIG. 9, a semiconductor device 2 according to the present embodiment differs from the semiconductor device 1 (refer to FIG. 1) according to the first embodiment in that the plurality of p type layers 33 are not provided in the p type pillars 24 and in that the p type pillars 24 are formed continuously. Because of this, as illustrated in FIG. 10B, an aluminum concentration profile along the Z direction in each p type pillar 24 of the semiconductor device 2 is substantially uniform.

On the other hand, as illustrated in FIG. 9, in each of the n type pillars 23 in the semiconductor device 2, the low-concentration layers 31 and the high-concentration layers 32 are alternately arranged along the Z direction, similarly to the first embodiment. Because of this, as illustrated in FIG. 10A, a nitrogen concentration profile along the Z direction in each n type pillar 23 of the semiconductor device 2 is uniform in each low-concentration layer 31 similarly to the p type pillar 24 and has a peak in each high-concentration layer 32.

Next, a method for manufacturing the semiconductor device 2 according to the present embodiment will be described.

FIGS. 11A to 11D and 12A to 12C are cross-sectional views illustrating the method for manufacturing the semiconductor device according to the present embodiment.

First, a semiconductor substrate which is formed from silicon carbide and the conductivity type of which is the $n^+$ type is prepared, similarly to the first embodiment.

Figure 11A:
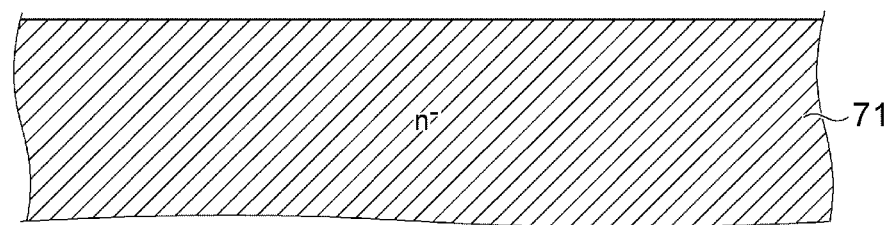
FIGS. 11A-11D and 12A-12C are cross-sectional views illustrating a method for manufacturing the semiconductor device according to the second embodiment.

Next, as illustrated in FIG. 11A, the epitaxial layer 71 which is formed from silicon carbide and the conductivity type of which is the $n^-$ type is formed on the semiconductor substrate. The epitaxial layer 71 uniformly contains the impurity to serve as the donor, e.g., nitrogen. The same applies to the epitaxial layers 72 and 73 to be described later.

Figure 11B:
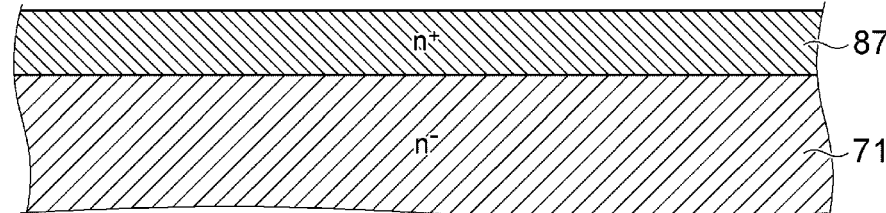

Next, as illustrated in FIG. 11B, nitrogen ions are implanted into an upper layer part 87 of the epitaxial layer 71.

Figure 11C:
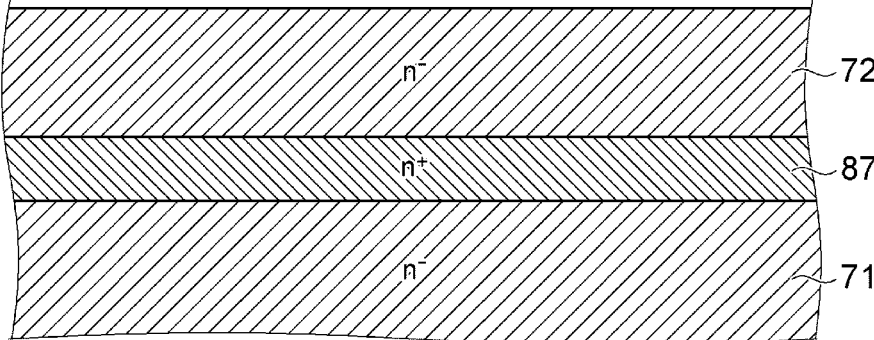

Next, as illustrated in FIG. 11C, the epitaxial layer 72 which is formed from silicon carbide and the conductivity type of which is the $n^-$ type is formed on the epitaxial layer 71.

Figure 11D:
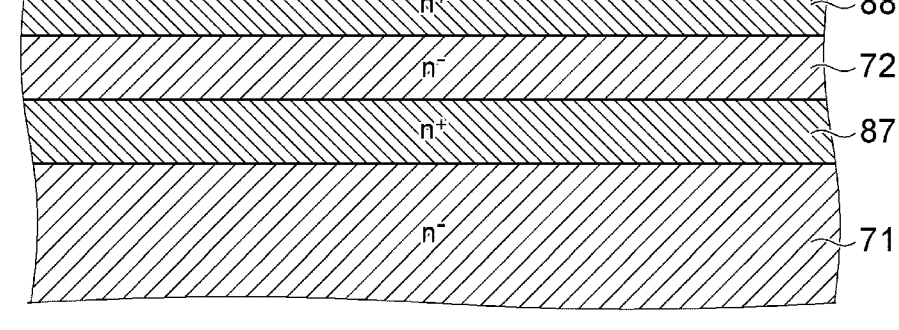
Figure 11D:
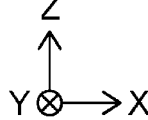

Next, as illustrated in FIG. 11D, nitrogen ions are implanted into an upper layer part 88 of the epitaxial layer 72.

Figures 12A, 12B, 12C:
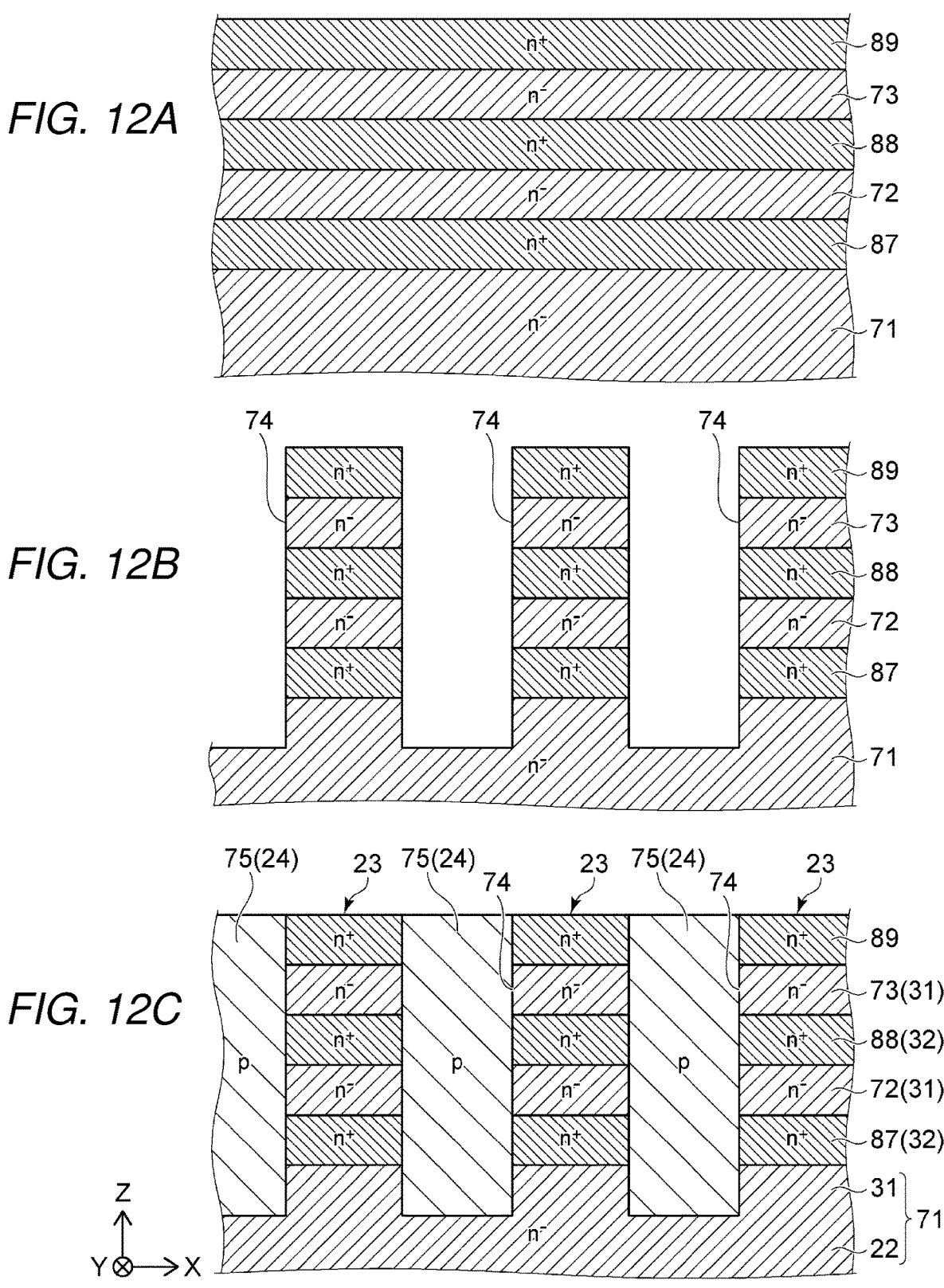

Next, as illustrated in FIG. 12A, the epitaxial layer 73 which is formed from silicon carbide and the conductivity type of which is the $n^-$ type is formed on the epitaxial layer 72. Next, nitrogen ions are implanted into an upper layer part 89 of the epitaxial layer 73.

Subsequently and similarly to the process described above, the process of forming the epitaxial layer which is formed from silicon carbide and the conductivity type of which is $n^-$ type and the process of injecting the impurity to serve as the donor into the upper layer part of this epitaxial layer is repeated a pre-selected number of times.

Next, as illustrated in FIG. 12B, holes 74 are formed in the epitaxial layers 71 to 73. The holes 74 are made to penetrate the epitaxial layers 73 and 72 and to reach an interior of the epitaxial layer 71.

Next, as illustrated in FIG. 12C, an epitaxial layer 75 which is formed from silicon carbide and the conductivity type of which is the p type is epitaxially grown in the holes 74. The epitaxial layer 75 uniformly contains the impurity to serve as the acceptor, e.g., aluminum.

By activating the impurities implanted into the parts, the epitaxial layer 75 becomes the p type pillars 24. On the other hand, parts located between the p type pillars 24 in the epitaxial layers 71 to 73 become the n type pillars 23. In each of the n type pillars 23, the upper layer parts 87 to 89 become the high-concentration layers 32 and the rest becomes the low-concentration layers 31. Subsequent processes are similar to those in the first embodiment.

According to the present embodiment, the impurity concentration of the p type pillars 24 can be made more uniform than according to the first embodiment. This can provide the hole discharge path in the Off state more reliably. The present embodiment is similar to the first embodiment in configurations other than those described above, a manufacturing method, and advantageous effects.

According to the embodiments and the modifications described so far, it is possible to provide the semiconductor devices capable of increasing the switching speed and the methods for manufacturing the same.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first electrode;
a first semiconductor layer of a first conductivity type provided on the first electrode;
a first pillar of a second conductivity type provided on the first semiconductor layer, the first pillar having a first average concentration of impurities of the second conductivity type;
a second pillar of the first conductivity type provided on the first semiconductor layer, and including a first layer having a second average concentration of impurities of the first conductivity type, that is lower than the first average concentration, and a second layer having a third average concentration of impurities of the first conductivity type, that is higher than the first average concentration;
a second semiconductor layer of the second conductivity type provided on the second pillar;
a third semiconductor layer of the first conductivity type provided on the second semiconductor layer;
a second electrode connected to the first pillar and the third semiconductor layer;
a third electrode; and
an insulating film disposed between the second semiconductor layer and the third electrode, wherein
a difference between a maximum value and a minimum value of the impurity concentrations in the first layer is smaller than a difference between a maximum value and a minimum value of the impurity concentrations in the second layer, and
a difference between a maximum value and a minimum value of the impurity concentrations in the first pillar is greater than the difference between the maximum value and the minimum value of the impurity concentrations in the first layer, and smaller than the difference between the maximum value and the minimum value of the impurity concentrations in the second layer.

2. The semiconductor device according to claim 1, wherein
the first semiconductor layer, the second semiconductor layer, the third semiconductor layer, the first layer, the second layer, and the first pillar contain silicon carbide.

3. The semiconductor device according to claim 1, wherein
the second pillar includes alternating layers of the first layer and the second layer along a first direction from the first electrode to the second electrode.

4. The semiconductor device according to claim 3, wherein
the first pillar has a plurality of layers of the second conductivity type along the first direction, each of the layers of the first pillar corresponding to one pair of the first layer and the second layer along the first direction, and
in each of the layers of the second pillar, an impurity concentration profile along the first direction has one peak, and in each of the second layers, an impurity concentration profile along the first direction has one peak.

5. The semiconductor device according to claim 1, wherein the second pillar has no layer having the third average concentration of impurities of the first conductivity type other than the second layer.

6. The semiconductor device according to claim 5, wherein the first layer is in direct contact with the first semiconductor layer and the second layer is in direct contact with the first layer.

7. The semiconductor device according to claim 5, wherein the first layer is in direct contact with the second layer and the second layer is in direct contact with the second semiconductor layer.

8. The semiconductor device according to claim 5, wherein the first layer and the second layer are between two other layers of the second pillar.

9. The semiconductor device according to claim 1, wherein the second pillar includes a third layer having the second average concentration of impurities of the first conductivity type, a fourth layer having the third average concentration of impurities of the first conductivity type, and a fifth layer having the second average concentration of impurities of the first conductivity type, and the fifth layer is between and in contact with the second layer and the third layer, and has twice the thickness of each of the first, second, third, and fourth layers.

\*    \*    \*    \*    \*